United States Patent
Nast et al.

(10) Patent No.: US 12,003,260 B2
(45) Date of Patent: Jun. 4, 2024

(54) ANTENNA UNIT, TRANSMISSION SYSTEM AND METHOD FOR OPERATING AN ANTENNA UNIT

(71) Applicant: Molex Technologies GmbH, Schönefeld (DE)

(72) Inventors: Helmut Nast, Berlin (DE); Thomas Bartsch, Zossen (DE); Lars Lehmann, Wildau (DE); Ahmed Sayed, Berlin (DE)

(73) Assignee: MOLEX TECHNOLOGIES GMBH, Schönefeld (DE)

( * ) Notice: Subject to any disclaimer, the term of this patent is extended or adjusted under 35 U.S.C. 154(b) by 693 days.

(21) Appl. No.: 17/055,125

(22) PCT Filed: May 14, 2019

(86) PCT No.: PCT/EP2019/062345
§ 371 (c)(1),
(2) Date: Jul. 28, 2021

(87) PCT Pub. No.: WO2019/219682
PCT Pub. Date: Nov. 21, 2019

(65) Prior Publication Data
US 2021/0351799 A1    Nov. 11, 2021

(30) Foreign Application Priority Data

May 14, 2018   (DE) .................. 10 2018 207 430.5

(51) Int. Cl.
*H04K 1/02*    (2006.01)
*H03F 3/24*    (2006.01)
(Continued)

(52) U.S. Cl.
CPC ........... *H04B 1/0458* (2013.01); *H03F 3/245* (2013.01); *H04B 1/18* (2013.01); *H04B 17/13* (2015.01); *H04B 17/21* (2015.01)

(58) Field of Classification Search
CPC ...... H04B 1/0458; H04B 17/13; H04B 17/21; H04B 1/18; H03F 3/245; H03G 3/3042; H03G 3/3047
(Continued)

(56) References Cited

U.S. PATENT DOCUMENTS 4,047,120 A   9/1977   Lord et al.
5,634,191 A   5/1997   Beasley
(Continued)

FOREIGN PATENT DOCUMENTS

CN   102340251 A   2/2012
CN   102810146 A   12/2012
(Continued)

OTHER PUBLICATIONS

International search report and written opinion received for PCT application No. PCT/EP2019/062345, dated Sep. 13, 2019, 18 pages (8 pages of English translation and 10 pages of Official copy).
(Continued)

*Primary Examiner* — Phuong Phu (57) ABSTRACT

An antenna unit is configured to transmit and/or receive signals and is connected to transmitting/receiving unit via a signal cable. A control device is configured to adjust signal strength by modifying gain of the control device. A calibration signal is provided by the transmitting/receiving unit and the signal strength of the calibration signal is used to adjust the gain of the control device.

19 Claims, 3 Drawing Sheets

(51) Int. Cl.
  *H04B 1/04* (2006.01)
  *H04B 1/18* (2006.01)
  *H04B 17/13* (2015.01)
  *H04B 17/21* (2015.01)
  *H04L 25/03* (2006.01)
  *H04L 25/49* (2006.01)

(58) Field of Classification Search
  USPC .................................. 375/296, 345, 297
  See application file for complete search history.

(56) References Cited

U.S. PATENT DOCUMENTS

| | | | |
|---|---|---|---|
| 6,301,128 B1 | 10/2001 | Jang et al. | |
| 6,370,364 B1* | 4/2002 | Liimatainen | H03G 3/3047 |
| | | | 455/127.2 |
| 7,606,535 B2 | 10/2009 | Shen et al. | |
| 7,808,322 B1* | 10/2010 | Son | H03G 3/3042 |
| | | | 330/285 |
| 7,965,977 B2 | 6/2011 | Angell et al. | |
| 9,191,903 B2 | 11/2015 | Sasson | |
| 9,491,713 B2 | 11/2016 | Dykyy et al. | |
| 10,063,203 B1 | 8/2018 | Harwalkar et al. | |
| 2005/0130595 A1 | 6/2005 | Shurvinton et al. | |
| 2006/0220739 A1* | 10/2006 | Ben-Ayun | H03G 3/3042 |
| | | | 330/140 |
| 2007/0129031 A1 | 6/2007 | Newton et al. | |
| 2008/0122379 A1 | 5/2008 | Henry et al. | |
| 2008/0137384 A1 | 6/2008 | Lin et al. | |
| 2009/0174263 A1 | 7/2009 | Baarman et al. | |
| 2013/0002357 A1 | 1/2013 | Thomsen et al. | |
| 2013/0039395 A1 | 2/2013 | Norconk et al. | |
| 2015/0244051 A1* | 8/2015 | Domino | H03H 17/0054 |
| | | | 333/81 R |
| 2016/0254700 A1 | 9/2016 | Akuzawa et al. | |
| 2017/0005592 A1 | 1/2017 | Yan et al. | |
| 2018/0062443 A1 | 3/2018 | Cho et al. | |
| 2018/0109246 A1 | 4/2018 | Zaplana | |
| 2018/0154786 A1 | 6/2018 | Wang et al. | |
| 2018/0270768 A1* | 9/2018 | Morhart | H03G 3/3042 |

FOREIGN PATENT DOCUMENTS

| | | |
|---|---|---|
| CN | 103716931 A | 4/2014 |
| CN | 104012176 A | 8/2014 |
| DE | 19614455 A1 | 10/1997 |
| DE | 102013207898 A1 | 10/2014 |
| DE | 102015217695 A1 | 3/2017 |
| EP | 0435228 A2 | 7/1991 |
| EP | 0461314 A1 | 12/1991 |
| JP | 2011065976 A | 3/2011 |
| WO | 2011113960 A2 | 9/2011 |

OTHER PUBLICATIONS

Office Action received for CN Application No. 201980032540.9, dated Mar. 14, 2022, 19 pages (09 Pages of English Translation and 10 Pages of Official notification).

* cited by examiner

ANTENNA UNIT, TRANSMISSION SYSTEM AND METHOD FOR OPERATING AN ANTENNA UNIT

RELATED APPLICATIONS

This application is a National Phase of International Application No. PCT/EP2019/062345, filed on May 14, 2019, which claims the benefit of German Application No. 10 2018 207 430.5, filed on May 14, 2018, each of which are incorporated herein by reference in their entirety.

TECHNICAL FIELD

The disclosure relates to a self-calibrating antenna unit, a transmission system comprising such an antenna unit and a method for operating such an antenna unit.

BACKGROUND

Antenna units which compensate for cable losses of a cable connection between the antenna unit and a signal-providing unit, e.g., a modem, are known from the prior art.

For example, U.S. Pat. No. 9,191,903 B2 discloses a method and a device for the efficient external control of a transmission power of an antenna unit. A feedback signal which the signal-providing unit receives from the antenna unit is essential for control.

U.S. Pat. No. 9,491,713 B2 discloses a compensation module which can be connected to a transmitting/receiving unit and to an antenna cable. The compensation module generates a parameter representing an output transmission power and transmits this parameter to the transmitting/receiving unit via the antenna cable.

A disadvantage of these solutions is that a signal transmission from the antenna unit to the signal-providing unit is required for operating the antenna unit, in particular for adjusting a gain factor. Corresponding signal interfaces and signal processing processes must be provided for this purpose. Overall, such an approach thus results in a complex and also cost-incurring system.

U.S. Pat. No. 7,965,977 B2 is also known. This discloses an antenna circuit with an amplifier unit for amplifying a transmission signal. A control unit controls the operation of the transmission amplifier. In this method, a so-called T/R control signal is provided, which represents a cable loss in a coaxial cable to which the antenna circuit is connected.

Also known is U.S. Pat. No. 5,634,191 which discloses that a signal strength is determined by a so-called base station extension unit and is transmitted, encoded as a data stream, to a so-called micro-cell extension unit with an antenna.

These technical teachings also disadvantageously require data transmission of a control signal for adjusting the amplification from a signal-providing unit to the antenna unit.

The technical task therefore arises of creating a self-calibrating antenna unit, a transmission system comprising such an antenna unit, and a method for operating an antenna unit which enable efficient and simple operation of the antenna unit and reduce manufacturing costs for the antenna unit.

SUMMARY

Proposed is a method for operating an antenna unit. The antenna unit may in particular serve to transmit a signal. The antenna unit may also serve to receive a signal. The signal may in particular be a WLAN signal, more in particular a signal according to the IEEE 802.11p standard. In this case, signals may in particular be transmitted in a frequency range of 5.8 GHz to 5.9 GHz. The signal may also be a mobile radio signal, more in particular a mobile radio signal according to the LTE V2V (Long-Term Evolution Vehicle-to-Vehicle) standard of the European ETSI 3GPP standards institute. Of course, it is however also conceivable to transmit other signals via the antenna unit.

The antenna unit may be an antenna unit of a vehicle, in particular of a motor vehicle. However, this is not mandatory. The antenna unit may also be used in other technical fields of application, e.g., in rail vehicles or in mobile terminals, for the remote control of vehicles or other devices or in other fields of application in which antenna units are used for signal transmission. If the antenna unit is arranged in a motor vehicle, it may in particular be used for so-called Car2Car communication. The antenna unit may in this case be arranged in or on the vehicle, for example in an interior rearview mirror of the vehicle, as a roof antenna, or integrated into the bumper of the vehicle, in particular as a distributed antenna.

The antenna unit has an antenna-side signal interface and a device-side signal interface. An antenna for transmitting and/or receiving signals may be connected to the antenna-side signal interface. A signal-providing unit, e.g., a transmitting/receiving unit, in particular a modem, may be connected to the device-side signal interface. It is possible for the antenna unit to be connected to the signal-providing unit via a signal connection means, e.g., a signal cable, in particular a coaxial cable. Signal transmission can take place via the cable. The antenna unit may also be supplied with energy via the cable. Cable losses may occur during transmission via the cable.

In this case, the antenna unit may serve to amplify transmission signals transmitted or emitted by the antenna. Alternatively or preferably cumulatively, the antenna unit may serve to amplify received signals received by the antenna.

The antenna unit furthermore comprises a control device, at least one device for adjusting a signal strength of a transmission signal and at least one device for detecting a signal strength of the transmission signal. The control device may be designed as a microcontroller or comprise such a microcontroller. The signal strength of a transmission signal may be increased by the device for adjusting a signal strength. Alternatively or cumulatively, the signal strength may also be reduced. The device may be designed as an amplifier device, in particular as an amplifier device with an adjustable gain factor. However, it is preferably designed as an attenuator device. In particular, the device for adjusting the signal strength is a device whose gain and/or attenuation factor is adjustable and thus enables the adjustment of the signal strength even under constant operating conditions.

A signal representing the signal strength, e.g., a voltage signal, may be generated by the device for detecting a signal strength. This device may, for example, be designed as a power detector.

In particular, a signal strength of a signal which is transmitted from the device for adjusting the signal strength to the antenna-side signal interface can be detected by means of the device for detecting the signal strength. In other words, the signal strength of an amplified signal can be detected. However, it is also possible for a signal strength of a signal which is transmitted from the device-side signal interface to the device for adjusting the signal strength to be detectable by means of the device for detecting the signal strength. In other words, the signal strength of an unamplified signal can be detected.

In a calibration process, a calibration signal is received via the device-side signal interface. The calibration signal may, for example, be provided, in particular generated, by the explained signal-providing unit. The calibration signal may be transmitted from the device-side signal interface to the antenna-side signal interface via the device for adjusting the signal strength.

In this case, the calibration signal may be a communication signal, wherein a communication signal may contain communication or useful data. In particular, the calibration signal may be a modulated signal. The calibration signal is preferably a modulated signal with a low crest factor describing the ratio of peak power to the average power of the signal. This makes a simple determination of the signal strength of the modulated signal possible. The calibration signal may also be an OFDM-modulated (Orthogonal Frequency-Division Multiplexing) signal. This also makes determination of the signal strength possible, wherein a temporal averaging of the signal strength over a time window of a predetermined duration may however be necessary in order to determine the signal strength. Of course, the modulated signal may also be modulated according to a different modulation method.

Alternatively, the calibration signal may not be a communication signal. It may, in particular, contain no communication or useful data. For example, the calibration signal may be an unmodulated signal, in particular a so-called CW (continuous wave) signal or carrier signal.

The calibration signal is in particular a signal whose signal strength can be determined simply, reliably and precisely.

The signal strength of the calibration signal, in particular of an amplified calibration signal, is also determined. The signal strength of the amplified calibration signal may be detected in this case. The signal strength of an amplified calibration signal may also be determined as a function of a signal strength of a calibration signal which is detected between the device-side signal interface and the antenna-side signal interface, in particular as a function of a detected signal strength of an unamplified calibration signal. The signal strength may be a signal power. In particular, the signal strength of the calibration signal transmitted via the device for adjusting the signal strength is determined. Furthermore, the signal strength determined in this way is compared to a reference signal strength. The reference signal strength may in particular be a prespecified signal strength, e.g., a prespecified maximum permissible transmission signal strength or a portion thereof. It may, for example, be stored in a memory device of the antenna unit. The reference signal strength may, for example, be a prespecified maximum transmission signal strength or maximum desired transmission signal strength and may be, for example, 23 dBm.

Furthermore, in particular by means of the control device, a gain factor of the at least one device for adjusting the signal strength is adjusted in such a way that the difference between the reference signal strength and the signal strength of the amplified calibration signal is minimized. In particular, the gain factor of the at least one device for adjusting the signal strength may be adjusted such that the difference between the reference signal strength and the determined signal strength is minimized.

In particular, the gain factor of the at least one device for adjusting the signal strength may be adjusted such that the difference between the reference signal strength and a signal strength of an amplified calibration signal is less than a predetermined threshold value or such that the signal strengths are equal.

The amplified calibration signal may refer to a calibration signal transmitted via the device for adjusting the signal strength. Such a signal is applied to a signal connection between the device for adjusting the signal strength and the antenna-side signal interface. In particular, the amplified calibration signal may refer to a signal applied to the antenna-side signal interface.

The gain factor may be an attenuation factor. In particular, the gain factor may be adjusted in such a way that a signal is amplified or attenuated.

After completion of the calibration process, the antenna unit is furthermore operated with the gain factor adjusted in this way.

The signal strength of the amplified calibration signal may in this case be detected as explained above, in particular by means of the device for detection. This signal strength may also be determined, in particular computationally, in particular as a function of an unamplified calibration signal. An unamplified calibration signal may refer to a calibration signal that is not transmitted via the device for adjusting the signal strength and is in this case applied between the device-side signal interface and the device for adjusting the signal strength. For example, a signal strength of an unamplified calibration signal may be determined, in particular detected as explained above, and then be multiplied by the gain factor that has been or is to be adjusted and, if applicable, by gain factors of further amplification devices in order to determine the signal strength of the amplified calibration signal.

For example, it is possible to determine the signal strength of the unamplified calibration signal applied to the device-side signal interface and then therefrom the signal strength of the amplified calibration signal.

The reference signal strength may thus denote a signal strength which forms a reference value for the signal strength of a signal transmitted via the device for adjusting the signal strength and thus amplified, in particular for a signal applied to the antenna-side signal interface. However, it is also conceivable that this reference signal strength is determined in accordance with the statements above as a function of a reference value for the signal strength of a signal which is not transmitted via the device for adjusting the signal strength and is thus unamplified, and of the gain factor that has been or is to be adjusted, the reference value thus representing a reference value for an unamplified signal.

The antenna unit may comprise at least a transmission signal branch, a transmission signal being transmitted from the device-side signal interface to the antenna-side interface via the transmission signal branch. The device for adjusting the signal strength may be arranged in the transmission signal branch. This may mean that the transmission signal can be transmitted from the device-side signal interface via the device to the antenna-side signal interface, wherein the signal strength of the transmission signal may also be adjusted, in particular changed. The device for detecting the signal strength may also be arranged in the transmission signal branch.

The antenna unit may furthermore also comprise at least one received signal branch, wherein a received signal may be transmitted from the antenna-side signal interface to the device-side interface via the received signal branch.

In addition to the device for adjusting the signal strength, the antenna unit may comprise at least one amplifier device, in particular a constant amplifier device, in the transmission signal branch. This device may also be referred to as transmission amplifier device.

A constant amplifier device may in this case denote an amplifier device whose gain factor cannot be adjusted, in particular not by a corresponding control signal. However, a gain factor of a constant amplifier device may change with a change in operating conditions, e.g., in the event of temperature changes. The constant amplifier device may thus denote an amplifier device whose gain factor is constant under constant operating conditions and cannot be changed.

Alternatively, however, it is also possible for the antenna unit to comprise as transmission amplifier device at least one amplifier device with an adjustable gain factor in the transmission signal branch. This device may form or provide the device for adjusting the signal strength.

The antenna unit may also comprise at least one further amplifier device in the received signal branch. This further amplifier device may also be a constant amplifier device or an amplifier device with an adjustable gain factor. This device may also be referred to as receiving amplifier device. In particular, the signal strength of the calibration signal transmitted via the device for adjusting the signal strength and via the transmission amplifier device may be determined by means of the device for detecting the signal strength.

The control device, the at least one device for adjusting a signal strength of a transmission signal and the at least one device for detecting a signal strength of the transmission signal may be connected using signaling technology.

The antenna unit may furthermore comprise a temperature sensor for detecting a temperature of the antenna unit. The latter may be connected to the control device using signaling technology. The antenna unit may furthermore comprise a voltage sensor for detecting a supply voltage level of the supply voltage of the antenna unit. The latter may be connected to the control device using signaling technology.

The calibration process may have a time period from a predetermined time period range, for example from 1 ms to 5 ms. The calibration process may be carried out in a calibration mode of the antenna unit. This calibration mode may be activated to carry out the calibration process. After completion of the calibration process, a normal operating mode may be activated. The gain factor determined in the calibration process is then used in the normal operating mode. In this case, the normal operating mode may immediately follow the calibration mode. In calibration mode, the antenna unit is not used for the intended signal transmission of transmission or received signals.

The proposed method advantageously results in a simple and reliable calibration of the gain factor and thus a reliable operation of the antenna unit, in which signal losses during the transmission of a signal from the signal-providing unit to the antenna unit are compensated. The gain factor is determined and adjusted, in particular exclusively, by the antenna unit and does not require any additional exchange of information with the signal-providing unit. No information about a signal strength, e.g., in the form of data, therefore needs to be transmitted between the antenna unit and the signal-providing unit. The reduced need for data transmission also results in more efficient operation of the antenna unit. Since a corresponding signal interface thus does not have to be provided either, manufacturing costs for the antenna unit and the signal-providing unit can be reduced. Simple retrofitting of an antenna unit is also made possible since it does not have to be designed for a corresponding communication of signal strength with the signal-providing unit. Furthermore, it advantageously results that, as an alternative or in addition to the compensation of the transmission-related signal losses, undesirably low signal strengths of the signal provided by the signal-providing unit can be compensated by the proposed method.

In another embodiment, the calibration signal is generated by a signal-providing unit and transmitted to the antenna unit via a signal connection means via the device-side signal interface. This advantageously results in a simple generation of the calibration signal since the antenna unit is also connected to the signal-providing unit during normal operation. It is thus possible in this case for the signal-providing unit to generate the necessary calibration signal during the calibration process. For this purpose, the signal-providing unit may likewise be switched to a calibration mode, in particular simultaneously with the antenna unit. The calibration mode of both units may preferably be activated simultaneously, e.g., immediately after simultaneous switching-on or activation of both units. The sequence and the type of functions carried out during the calibration mode may, in this case, be stored in the corresponding unit, e.g., in firmware.

In another embodiment, the signal-providing unit generates the calibration signal with the maximally generatable signal strength or with a signal strength which corresponds to a prespecified portion of the maximum signal strength. In this case, it is possible for information about the magnitude of the portion to be stored, e.g., in a memory device of the antenna unit.

This enables a simple determination of the reference signal strength, wherein this may in particular be in relation to the antenna-side signal interface. Specifically, if the calibration signal is generated with the signal strength maximally generatable by the signal-providing unit, it may in particular be assumed that the antenna unit is to generate a transmission signal having a prespecified (desired) maximum transmission signal strength. This in turn then makes simple determination of the gain factor possible. The same applies if the calibration signal is generated with a proportional maximally generatable signal strength.

In another embodiment, the reference signal strength, in particular a signal strength in relation to the antenna-side signal interface, is determined such that the ratio of the reference signal strength to the prespecified maximum transmission signal strength is equal to the ratio of the signal strength of the signal generated by the signal-providing unit to the maximally generatable signal strength. This advantageously results in improved operational reliability during subsequent normal operation of the antenna unit since the probability of undesired generation of transmission signals with excessively high signal strengths is reduced.

In another embodiment, the maximum signal strength of the calibration signal that can be generated by the signal-providing unit is determined as a function of the detected signal strength of the calibration signal. For example, there may be different types of signal-providing units that can generate different maximum signal strengths, e.g., 5 dBm or 20 dBm. In such a calibration process, it may therefore be necessary for the antenna unit to determine how high the maximally generatable signal strength of a signal-providing unit connected to the antenna unit is. The determination may in particular exist as a function of a previously known assignment, in which different signal strength ranges are assigned to different maximally generatable signal strengths of a signal-providing unit. This assignment may be stored in the antenna unit, for example.

The previously explained portion or the previously explained ratio may also be determined as a function of the thus determined maximally generatable signal strength and/or the detected signal strength. For this purpose, an assignment between a portion and a signal strength of the calibration signal may exist, in particular for each identifiable maximally generatable signal strength, wherein the portion may be determined as a function of this assignment.

This advantageously results in higher reliability and accuracy in calibration, in particular if the calibration signal is not generated by the signal-providing unit with the maximally generatable signal strength.

In another embodiment, a calibration process is carried out after each switching-on or activation of the antenna unit. In other words, the calibration mode may be activated after each switching-on of the antenna unit. An "activation" may mean that the antenna unit is switched from a not fully operational state into a fully operational mode. The switching-on or activation may in particular take place when a power supply of the antenna unit required for normal operation is established.

If such a power supply is effected by the signal-providing unit, e.g., via the explained cable, the switching-on or activation of the signal-providing unit may simultaneously or roughly simultaneously result in the antenna unit being switched on or activated. This advantageously results in switching-on or activation processes of the units and thus also activation of the corresponding calibration modes being able to be reliably synchronized.

If the antenna unit is arranged in a vehicle, the antenna unit may be switched on or activated, for example, whenever the "ignition on" state of the vehicle is established.

In a preferred embodiment, the device for adjusting the signal strength is, for example, an attenuator device. In this case, the gain factor is an attenuation factor. With the attenuator device, a signal strength of a signal transmitted via the attenuator device may be reduced or left unchanged but may not be increased. This advantageously results in a simple production of an antenna unit. In particular, existing antenna units without adjustable amplification, e.g., with the previously explained constant amplifier devices, which are regularly available as prefabricated modules complying with desired standards, can be retrofitted in order to enable self-calibration.

Alternatively, the device for adjusting the signal strength is an amplifier device with an adjustable gain factor.

In another embodiment, both a signal strength of a transmission signal and a signal strength of a received signal can be adjusted or changed by the device for adjusting the signal strength. In other words, the device for adjusting the signal strength may be arranged both in the transmission signal branch and in the received signal branch. This advantageously results in balanced amplification between the transmission signal and the received signal, as a result of which approval requirements can be met, for example. Moreover excessive amplification of the received signal by the antenna unit is prevented and also the signal-providing unit being subjected to an excessively high signal power.

In another embodiment, a temperature or a temperature change of the antenna unit is determined, wherein, in particular after completion of the calibration process, the gain factor of the device for adjusting the signal strength, i.e., in particular the gain factor determined in the calibration process, is changed, i.e., increased or reduced, for example, as a function of the temperature or the temperature change. In particular, the gain factor may be changed as a function of the temperature in such a way that a temperature-related change in the overall amplification of the antenna unit is minimized or fully compensated. In other words, the gain factor may be changed temperature-dependently with temperature changes of the antenna unit such that the overall amplification of the antenna unit remains constant or approximately constant.

For example, it is possible for the gain factor to be adjusted, in particular changed, as a function of a previously known relationship between a temperature or temperature change and a gain factor or change in the gain factor. The previously known relationship may be given, for example, in the form of a function or an assignment, in particular in the form of a characteristic curve.

In particular, it is possible for a temperature to be determined as the reference temperature during the calibration process, wherein the gain factor is then changed as a function of a difference between the reference temperature and the currently determined temperature. For example, it is possible for the gain factor to be adjusted, in particular changed, as a function of a previously known relationship between the difference and a gain factor or change in the gain factor. This previously known relationship may also be provided, for example, in the form of a function or an assignment, in particular in the form of a characteristic curve. For example, the smaller the value of the difference, the more the transmission signal may be amplified, wherein there is a signed approach. With increasing temperature, the amplification of the amplifier device for the transmission signal may be reduced. In order to keep the overall amplification of the antenna unit constant over the temperature, the gain factor of the signal adjusting device, i.e., for example, the attenuation device, may then be reduced in such a way that the overall amplification of the antenna unit remains constant. In other words, a signal gain factor may also be increased, for example, with rising temperatures above the reference temperature.

As a result of such a temperature-dependent adjustment of the gain factor, it may be achieved that, depending on the temperature change, the maximum reference power (e.g., 23 dBm) of the antenna unit is not exceeded or undershot when the signal-providing unit transmits at the maximum power.

This advantageously increases an operational quality of the antenna unit, in particular since temperature-related changes in the amplification can be compensated completely or at least partially.

In another embodiment, a level of the supply voltage of the antenna unit is determined. The supply voltage may in particular also be a supply voltage of a constant amplifier device, e.g., of the transmission amplifier device. Furthermore, in particular after completion of the calibration process, the gain factor of the device for adjusting the signal strength, i.e., in particular the gain factor determined in the calibration process, is changed as a function of the level of the supply voltage. The gain factor may in particular be changed as a function of the supply voltage such that a supply-voltage-related change in the overall amplification of the antenna unit is minimized or completely compensated. In other words, with changes in the supply voltage of the antenna unit, the gain factor may be changed as a function of the supply voltage such that the overall amplification of the antenna unit is constant or approximately so.

For example, it is possible for the gain factor to be adjusted, in particular changed, as a function of a previously known relationship between the supply voltage level or change in the supply voltage level and a gain factor or change in the gain factor. The previously known relationship may be given, for example, in the form of a function or an assignment, in particular in the form of a characteristic curve.

In particular, it is possible for a supply voltage level to be determined as the reference supply voltage level during the calibration process, wherein the gain factor is changed as a function of a difference between the reference supply voltage level and the currently determined supply voltage level. In this case, it is, for example, possible for the gain factor to be adjusted, in particular changed, as a function of a previously known relationship between the difference and a gain factor or change in the gain factor. The previously known relationship may be given, for example, in the form of a function or an assignment, in particular in the form of a characteristic curve.

In particular, the smaller the value of the difference, the more the transmission signal may be amplified, with a signed approach taking place. For example, with a supply voltage level increasing above the reference supply voltage, a signal gain factor may be reduced.

This advantageously increases an operational quality of the antenna unit, in particular since supply-voltage-related changes in the amplification can be fully or at least partially compensated.

In another embodiment, during the calibration process, the amplified calibration signal is not transmitted to an antenna, in particular to an antenna connected to the antenna-side signal interface. In particular, the amplified calibration signal may be fed into or transmitted to an antenna equivalent resistor. Erroneous calibration, which would occur if external influences were to change the antenna properties, may furthermore be advantageously avoided.

For this purpose, the antenna equivalent resistor may be connected to the antenna-side signal interface or the transmission signal branch may be connected to the antenna equivalent resistor instead of the antenna-side signal interface, e.g., via a suitable switching means of the antenna unit.

This advantageously results in improved operational reliability of the antenna unit since in the calibration process, the antenna does not transmit a signal which may, for example, disturb the operation of other units.

However, it is, of course, also possible for the amplified calibration signal to be transmitted to the antenna during the calibration process.

In another embodiment, a transmission mode of the antenna unit is activated, the calibration process being carried out in the transmission mode. In particular, the calibration process may be carried out only when the transmission mode is activated.

For example, the transmission mode may be activated when an activation signal is received from the antenna unit or when a mode control signal has a prespecified signal level. A receive mode may also be activated, e.g., when no activation signal is received or the mode control signal does not have the prespecified signal level. In the transmission mode, a signal connection between the device-side signal interface and the antenna-device-side signal interface is established via a transmission signal branch. Accordingly, in the receive mode, a signal connection is established between the device-side signal interface and the antenna-device-side signal interface via a received signal branch.

The activation signal or mode control signal is preferably generated by the signal-providing unit and transmitted to the antenna unit, e.g., via the signal connection means explained above. In the antenna unit, the activation signal or the mode control signal may be extracted from the transmitted signal, e.g., filtered out or decoupled. The activation signal or mode control signal may have frequencies from a frequency range that is different from frequencies of the communication signal, e.g., frequencies from a range of 120 MHz to 130 MHz. The calibration process can thus be carried out, for example, only when the signal-providing unit generates a corresponding activation signal or mode control signal. For example, it is possible for the signal-providing unit to generate a corresponding activation signal or mode control signal whenever it is switched on or activated.

Alternatively, it is also possible for the transmission mode to be activated for the calibration process independently of the activation signal or mode control signal. For example, it is possible for the antenna unit to activate the transmission mode whenever it is switched on or activated.

This advantageously results in increased reliability when performing the calibration.

It is furthermore possible that during normal operation of the antenna unit, i.e., also after completion of the calibration process, the transmission mode or receive mode of the antenna unit is adjusted with the activation signal or mode control signal, in particular by the signal-providing unit.

In another embodiment, the gain factor at the beginning of the calibration process is determined as a function of at least one gain factor which was determined in a previous calibration process. For example, it is possible for the gain factor determined in a calibration process to be stored, e.g., in a memory device of the antenna unit. For example, at the beginning of a current calibration process, the gain factor may be adjusted to the gain factor stored in a previous calibration process, in particular in the immediately preceding calibration process.

The gain factors determined in all or in a prespecified number of calibration processes may also be stored. For example, at the beginning of a current calibration process, the gain factor may be adjusted to the average value of this plurality of stored gain factors.

This advantageously results in a faster determination of the gain factor in the calibration process since it may be assumed as a rule that the gain factor does not change or changes by no more than a predetermined value between two calibration processes, in particular chronologically closely successive calibration processes. The use of the previously determined gain factor as the starting value in the determination thus regularly quickly results in the determination of the currently applicable gain factor.

In another embodiment, the control device detects an error state if the minimized difference is greater than a prespecified threshold value. If an error state is detected, an operating behavior of the antenna unit may be changed, in particular by the control device. For example, one or more constant amplifier devices may be deactivated. The connection to the antennas may also be interrupted. A connection to the explained antenna equivalent resistor may also be established. This advantageously makes it possible for an error in the calibration to be detectable by external devices, e.g., the signal-providing unit, without the antenna unit having to transmit error data. For example, the signal-providing unit may determine a current intensity of a signal transmitted via the signal connection means and detect an error state as a function of the current intensity. If an error is detected, suitable error actions may thus be initiated, e.g., the output of an error signal to a superordinate system or a user.

At this point, it should be noted that an error state may be detectable by an external device even without a change in the operating behavior of the antenna unit. For example, a gain factor that does not reduce the explained difference to zero or to a prespecified value may already lead to an operating behavior of the antenna unit being adjusted such that the signal-providing unit detects an error state as a function of the explained current intensity.

In another embodiment, a signal strength of the transmission signal is determined, in particular after completion of the calibration process, wherein the gain factor, in particular the gain factor determined in the preceding calibration process, is changed as a function of the signal strength. The signal strength may be detected by the explained device for detecting the signal strength. Furthermore, the gain factor may in particular be adjusted such that a prespecified maximum permissible limit value of the signal strength is not exceeded.

This advantageously increases operational reliability of the antenna unit.

A self-calibrating antenna unit is also proposed. The antenna unit is in this case designed according to one of the embodiments disclosed in this disclosure.

In a calibration process, a calibration signal can be received via the device-side signal interface, wherein the signal strength of the calibration signal, in particular of an amplified or unamplified calibration signal, can be determined, wherein the determined signal strength, in particular the signal strength of an amplified calibration signal can be compared to a reference signal strength, wherein a gain factor of the at least one device for adjusting the signal strength is adjusted in such a way that the difference between the reference signal strength and the determined signal strength, in particular a signal strength of the amplified calibration signal, is minimized, wherein the antenna unit can be operated with the thus adjusted gain factor after completion of the calibration process.

The antenna unit is thus configured such that a method according to one of the embodiments described in this disclosure can be carried out with the antenna unit.

It is possible but not mandatory for the antenna unit to comprise an interface for data transmission, e.g., for communication, with an external unit, in particular with the signal-providing unit. For example, diagnostic information or information about error states may be transmitted via this interface. However, the interface is in particular not designed to transmit information about a gain factor from the antenna unit to an external unit or from an external unit to the antenna unit. Of course, the antenna unit may however also be designed such that it does not comprise such an interface.

Also proposed is a transmission system comprising a self-calibrating antenna unit according to one of the embodiments described in this disclosure, as well as a signal-providing unit, wherein the antenna unit and the signal-providing device are connected via a signal connection means. This and corresponding advantages have already been explained above.

It is possible for the antenna unit and the signal-providing unit to be exclusively connected via the signal connection means via which a signal provided or generated by the signal-providing unit is transmitted to the antenna unit for transmission or a signal received by the antenna unit is transmitted to the signal-providing unit. In particular the system, more in particular the elements of the system, may be configured in such a way that no information about a gain factor is transmitted between the units via the signal connection means.

BRIEF DESCRIPTION OF THE DRAWINGS

The disclosure is explained in more detail with reference to exemplary embodiments. The figures show.

The same reference signs hereinafter denote elements having the same or similar technical features.

DETAILED DESCRIPTION OF THE PREFERRED EMBODIMENTS

Figure 1:
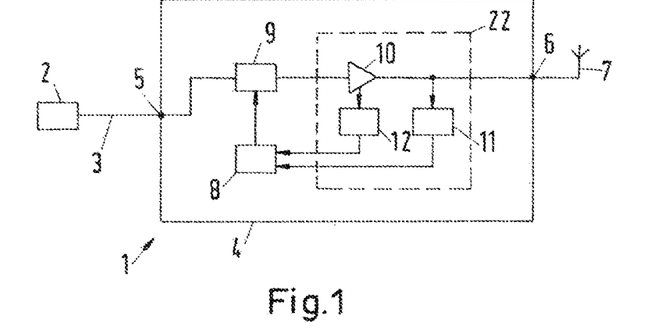
FIG. 1 a schematic block diagram of a transmission system according to the disclosure in accordance with a first embodiment, FIG. 1a a schematic block diagram of a transmission system according to the disclosure in accordance with another embodiment, FIG. 2 a schematic block diagram of a transmission system according to the disclosure in accordance with another embodiment, FIG. 3 a schematic block diagram of a transmission system according to the disclosure in accordance with another embodiment, FIG. 4 a schematic flowchart of a method according to the disclosure, and FIG. 5 a schematic block diagram of a transmission system according to the disclosure in accordance with another embodiment.

FIG. 1 shows a schematic block diagram of a transmission system 1 according to the disclosure. The transmission system 1 comprises a signal-providing unit 2 which may be designed as a modem, for example The signal-providing unit 2 may in particular be designed as a transmitting/receiving unit. This unit may serve to transmit and receive WLAN signals, in particular WLAN signals in accordance with the IEEE 802.11p standard or mobile radio signals according to the LTE V2V (Long-Term Evolution Vehicle-to-Vehicle) standard of the European ETSI 3GPP standards institute. The transmitting/receiving unit 2 is connected to an antenna unit 4 according to the disclosure via a signal connection means taking the form of a coaxial cable 3. The antenna unit 4 comprises a device-side signal interface 5 via which the antenna unit 4 is connected to the transmitting/receiving unit 2 by means of the coaxial cable 3. The antenna unit 4 furthermore comprises an antenna-side signal interface 6. An antenna 7 may be connected to the antenna unit 4 via the antenna-side signal interface 6. In this case, it is possible for the antenna unit 4 to also comprise the antenna 7. For example, elements of the antenna unit 4 as well as the antenna 7 may thus be arranged on a common printed circuit board. However, this is not mandatory.

The antenna unit 4 furthermore comprises a control device 8. This control device 8 may be designed as a microcontroller or comprise a microcontroller. The antenna unit 4 furthermore comprises a device, designed as an attenuator device 9, for adjusting or changing a signal strength of a transmission signal. A transmission signal is in this case generated by the signal-providing unit 2 and transmitted to the antenna unit 4 via the coaxial cable 3 and via the device-side signal interface 5. The transmission signal is furthermore transmitted from the device-side signal interface 5 via the attenuator device 9 and an amplifier device 10 of the antenna unit 4 also referred to as transmission amplifier device, to the antenna-side signal interface 6 and from there to the antenna 7. The transmission amplifier device 10 may be designed as a constant amplifier device. The antenna unit 4 thus also comprises the transmission amplifier device 10. Both the attenuator device 9 and the constant amplifier device 10 are arranged in a transmission signal branch of the antenna unit 4.

The antenna unit furthermore comprises a device, designed as a power detector 11, for detecting a signal strength of a transmission signal. As is shown, the power detector 11 detects the signal strength of a signal which is transmitted from the constant amplifier device 10 to the antenna-side signal interface 6, i.e., of an amplified signal. The power detector 11 may, for example, generate a voltage signal which represents, in particular is proportional to, the signal strength or a signal power of the transmission signal. The power detector 11 is in this case connected to the control device 8 using signaling technology.

Also illustrated is that the antenna unit 4 comprises a temperature sensor 12 for detecting a temperature of the antenna unit 4. This temperature sensor 12 is also connected to the control device 8 using signaling technology.

It is possible that a transmission amplifier device 10 having a power detector 11 and a temperature sensor 12 is embodied as an integrated circuit 22. This common embodiment is indicated by a rectangle represented by dashed lines and may also be referred to as front-end module.

The attenuator device 9 may be a so-called variable attenuator device. The attenuator device 9 may in particular be designed as a digital attenuator device (digital attenuator). The attenuator device 9 is connected to the control device 8 using signaling technology. The control device 8 may in this case adjust an attenuation factor of the attenuator device 9. By means of the attenuator device 9, a signal strength of the transmission signal transmitted from the device-side signal interface 5 to the attenuator device 9 may be reduced, in particular if the attenuation factor is greater than 1. The signal strength may also be left unchanged, in particular if the attenuation factor is 1. Amplification of this signal by means of the attenuator device 9 is not possible.

The illustrated antenna unit 4 forms a self-calibrating antenna unit 4. An attenuation factor may be determined in a calibration process of the antenna unit 4, this attenuation factor being used by the control device 8 for the operation (normal operation) of the antenna unit 4 after completion of the calibration process. The attenuation factor may in this case be determined by the control device 8 as a function of the output signal of the power detector 11.

It is possible for the antenna unit 4 to be supplied with energy by the signal-providing unit 2, wherein the corresponding energy is transmitted via the coaxial cable 3.

A calibration process may in this case be carried out immediately after each switching-on or activation of the antenna unit 4, for example. If the signal-providing unit 2 is supplied with energy, the calibration process may be carried out after each switching-on or activation of the signal-providing unit 2 since in this case the antenna unit 4 is switched on or activated whenever the signal-providing unit 2 is also switched on or activated.

In a calibration process, the antenna unit 4 receives a calibration signal via the device-side signal interface 5. The calibration signal may in this case be generated by the signal-providing unit 2. For example, it is possible for the signal-providing unit 2 to also carry out a calibration process or to take part in the calibration process of the antenna unit 4 after each switching-on or activation, e.g., in that the signal-providing unit 2 generates the calibration signal immediately after switching-on or activation. A corresponding functionality of the signal-providing unit 2 may, for example, be provided by the corresponding functionality being encoded in the firmware of the signal-providing unit 2.

The signal-providing unit 2 preferably generates, as a calibration signal, a signal with the maximum signal strength that can be generated by the signal-providing unit 2. This may be, for example, 5 dBm or 20 dBm.

Furthermore determined in the calibration process is the signal strength of the calibration signal transmitted via the attenuator device 9 and the transmission amplifier device 10 and thus amplified. This may be done by means of the power detector 11 and the control device 8.

Furthermore, the signal strength determined in this way is compared to a reference signal strength, in particular likewise by the control device 8. The reference signal strength may, for example, be a prespecified maximum transmission signal strength which is to be adjusted by the antenna unit 4 for a transmission signal transmitted from the antenna-side signal interface 6 to the antenna 7. Such a predetermined maximum transmission signal strength may be 23 dBm, for example. Of course, it is however also possible to select other prespecified maximum transmission signal strengths. It is possible for the reference signal strength to be stored, e.g., in a memory device of the antenna unit 4 not shown in FIG. 1 or in an internal memory device of the control device 8, e.g., a memory in a microcontroller.

The attenuation factor of the attenuation device 9 is also adjusted by means of the control device 8 in such a way that the difference between the reference signal strength and the determined signal strength of the calibration signal is minimized. The attenuation factor is preferably adjusted such that the difference is 0 or deviates from 0 by no more than a predetermined value.

After completion of the calibration process, the antenna unit 4, in particular the attenuator device 9, is then operated with the attenuation factor determined in this way. It is also possible to store the attenuation factor determined in a calibration process, e.g., also in the previously explained memory device or in a further memory device. In this case, it is in particular possible for the attenuation factor to be adjusted at the beginning of a new calibration process as a function of an attenuation factor which was determined in a previous calibration process.

The calibration process described advantageously makes it possible to compensate for signal losses caused by the coaxial cable without the need for additional signal transmission between the antenna unit 4 and the signal-providing unit 2. Descriptively speaking, assuming that the maximally generatable signal strength is provided by the signal-providing unit 2 in a calibration process, the attenuation factor will be determined such that a prespecified desired maximum transmission signal strength is provided by the antenna unit 4 at the antenna-side signal interface 6. It may thus be assumed that the attenuation factor is determined in such a way that the cable losses caused by the coaxial cable 3 are compensated. Since the cable losses are not a function of the signal strength, the attenuation factor adjusted in this way also ensures reliable and accurate compensation of the cable losses in a normal operation taking place after the calibration process, in particular also for signal strengths which deviate from the maximally generatable signal strength of the signal-providing unit 2.

However, it is also possible for the signal-providing unit 2 to generate in a calibration process a calibration signal, not with the maximally generatable signal strength but with a signal strength which corresponds to a prespecified portion of the maximally generatable signal strength. Information, in particular a numerical value of this portion, may be prespecified. This information may, for example, likewise be stored in the memory device of the antenna unit 4 explained above.

In this case, a portion of the prespecified maximum transmission signal strength may be selected as the reference signal strength. In such a calibration process, however, it may be necessary for the antenna unit 4 to determine how high is the maximally generatable signal strength of a signal-providing unit 2 connected to the antenna unit 4. Specifically, it may be assumed that different signal-providing units 2 can generate different maximally generatable signal strengths. The maximally generatable signal strength may in this case be determined or identified as a function of the signal strength of the calibration signal determined during the calibration process. For example, an assignment may thus exist in which different signal strength ranges are assigned to different maximally generatable signal strengths of a signal-providing unit 2. This assignment may, for example, be stored in the antenna unit 4, in particular in one of the memory devices explained above. The maximally generatable signal strength of the signal-providing unit 2 may then be determined as a function of this assignment. If it is known, for example, that different types of signal-providing units 2 can generate either a maximally generatable signal strength of 5 dBm or 20 dBm, it may be assumed that at signal strengths of the calibration signal less than 5 dBm, the signal strength maximally generatable by the signal-providing unit 2 will be 5 dBm, wherein the signal strength maximally generatable by the signal-providing unit 2 will be 20 dBm at signal strengths of the calibration signal greater than 5 dBm.

Furthermore, the corresponding portion may also be determined as a function of the maximally generatable signal strength determined in this way. For this purpose, an assignment between a portion and a signal strength of the calibration signal may exist, in particular for each identifiable maximally generatable signal strength, wherein the portion may be determined as a function of this assignment.

It is furthermore possible for the temperature of the antenna unit 4 to be determined during the calibration process, in particular by means of the temperature sensor 12. This temperature may, for example, be stored in particular in one of the memory devices explained above.

After completion of the calibration process, in particular in normal operation of the antenna unit 4, the temperature of the antenna unit 4 may then be determined continuously by means of the temperature sensor 12. Furthermore, the attenuation factor may be adjusted, in particular changed, as a function of the difference between the currently detected temperature and the temperature detected during the preceding calibration process. For example, the higher the said difference, the lower the attenuation factor may be adjusted at temperatures higher than the temperature of the calibration process.

It is not shown in FIG. 1 that a supply voltage level of the antenna unit 4, in particular a supply voltage level of the transmission amplifier device 10, may also be determined. For this purpose, the antenna unit 4 may comprise a voltage sensor not shown in FIG. 1. The supply voltage level may in this case be determined during the calibration process. This supply voltage level may, for example, be stored in particular in one of the memory devices explained above.

During normal operation, the supply voltage level may also be detected continuously. Furthermore, the attenuation factor may be adjusted as a function of a difference between the currently detected supply voltage level and the supply voltage level detected during the preceding calibration process. If, for example, the currently detected supply voltage level is below the supply voltage level detected during the calibration process, the attenuation factor may be reduced with increasing difference or with increasing magnitude of the difference.

It is furthermore possible for the signal strength of the transmission signal to also be determined continuously, in particular by means of the power detector 11. If the signal strength detected by means of the power detector 11 exceeds a prespecified maximum permissible signal strength, the attenuation factor of the attenuator device 9 may be adjusted, in particular by means of the control device 8, such that the transmission signal strength is adjusted and thus limited to the maximum permissible transmission signal strength. In this way, it is advantageously achieved that no undesired operating state of the antenna unit 4 will occur and no desired high transmission power will be transmitted permanently by the antenna unit 4.

In other words, self-calibration of the antenna unit 4 is made possible. During the calibration process, an attenuation factor, which is given as an example of a gain factor, is determined, wherein this factor is adjusted for the normal operation following the calibration process. This attenuation factor is ideally constant during normal operation. However, in order to compensate for temperature- and/or supply-voltage-related changes in the amplification behavior of the antenna unit 4 during normal operation, the attenuation factor determined by the self-calibration may also be changed during normal operation. The attenuation factor may likewise be changed during normal operation in order to limit the maximally generated transmission signal strength to a maximum permissible transmission signal strength.

Figure 1A:
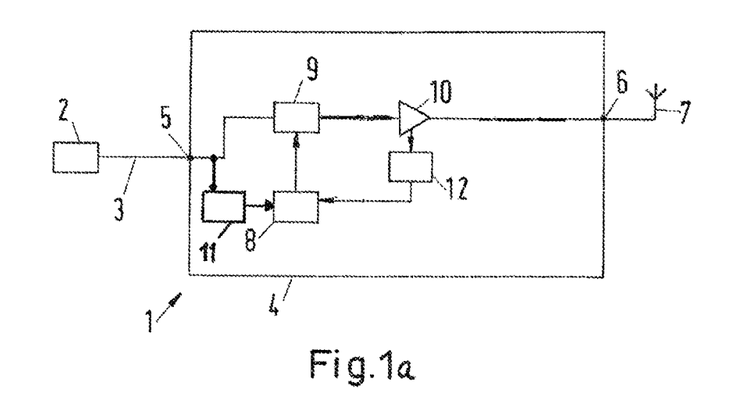

FIG. 1a shows a schematic block diagram of a transmission system 1 according to the disclosure in another embodiment. The transmission system 1 shown in FIG. 1a is in this case designed substantially like the transmission system 1 shown in FIG. 1. Reference can therefore be made to the corresponding statements relating to FIG. 1. In contrast to FIG. 1, the power detector 11 detects the signal strength of a signal which is transmitted from the device-side signal interface 5 to the attenuator device 9, i.e., an unamplified signal.

Furthermore, in a calibration process, the signal strength of the (unamplified) calibration signal transmitted from the device-side signal interface 5 to the attenuator device 9 is determined. This may be done by means of the power detector 11 and the control device 8. Furthermore, in particular by means of the control device 8, a signal strength of the amplified calibration signal is determined by multiplying the detected signal strength by the currently adjusted gain factors of the attenuator device 9 and of the constant amplifier device 10.

Furthermore, the signal strength of the amplified calibration signal determined in this way is compared to a reference signal strength, in particular likewise by the control device 8.

The attenuation factor of the attenuation device 9 is also adjusted by means of the control device 8 in such a way that the difference between the reference signal strength and the signal strength of the calibration signal determined as explained is minimized. The attenuation factor is preferably adjusted such that the difference is 0 or deviates from 0 by no more than a predetermined value.

After completion of the calibration process, the antenna unit 4, in particular the attenuator device 9, is then operated with the attenuation factor determined in this way.

Figure 2:
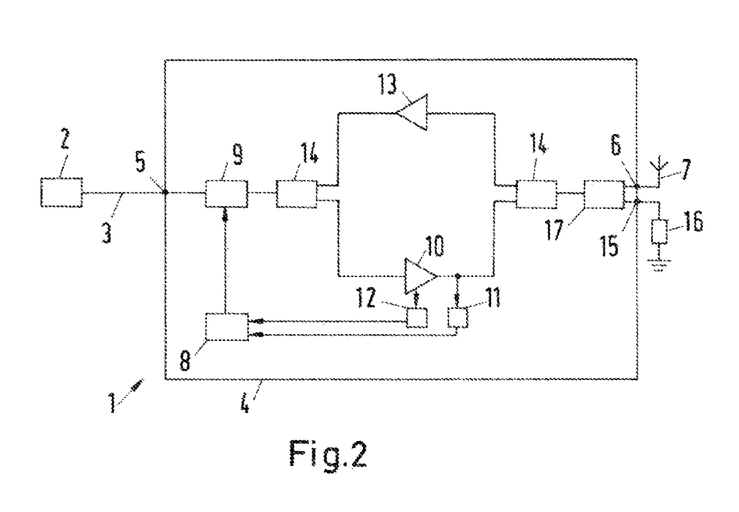

FIG. 2 shows a block diagram of a transmission system 1 according to the disclosure in another embodiment. Reference can in this case be made to the explanations relating to FIG. 1. In contrast to the embodiment illustrated in FIG. 1, a received signal branch is also shown in addition to the transmission signal branch explained above. A signal received by the antenna 7 may be transmitted via the antenna-side signal interface 6 to the antenna unit 4 via the received signal branch. The antenna unit 4 in this case comprises a further amplifier device 13, also referred to as a receiving amplifier device, for amplifying such a received signal, which device may be designed as a constant amplifier device. Also shown is that the antenna unit 4 comprises switching means 14 for producing signal connections via a transmission signal branch or the received signal branch. In a transmission mode, the switching means 14 are actuated in such a way that a transmission signal is transmitted from the device-side signal interface 5 via the attenuator device 9 and the transmission amplifier device 10 to the antenna-side signal interface 6. In a receive mode, the switching means 14 may be actuated in such a way that a signal connection is established from the antenna-side signal interface 6 via the receiving amplifier device 13 and the attenuator device 9 to the device-side signal interface 5.

The switching means 14 may in this case be controlled by the control device 8.

Also illustrated is that the antenna unit 4 comprises a resistor-side signal interface 15 to which an antenna equivalent resistor 16 is connected. The antenna unit 4 furthermore comprises a further switching means 17. By means of the further switching means 17, a signal output of the transmission amplifier device 10 may be connected either to the antenna-side signal interface 6 or to the resistor-side signal interface 15. The further switching means 17 may, in this case, also be controlled by the control device 8.

During the calibration process, the further switching means 17 may in particular be actuated in such a way that the signal output of the transmission amplifier device 10 for amplifying the transmission signal (and thus the calibration signal) is connected to a reference or ground potential via the equivalent resistor 16. In this way, it is advantageously achieved that no transmission signal which can form an undesired interference signal is emitted by the antenna 7 during the calibration process.

FIG. 2 also shows that the attenuator device 9 is arranged both in the transmission signal branch and in the received signal branch. During normal operation, the attenuation factor determined during the calibration process thus forms both the attenuation factor adjusted in the transmission mode and the attenuation factor adjusted in the receive mode of the antenna unit 4. This advantageously results in a simple production of the self-calibrating antenna unit 4 since the unit comprising the transmission amplifier device 10, the power detector 11 and the temperature sensor 12 and possibly the receiving amplifier device 13 and the switching means 14 is generally in the form of a prefabricated module, and a simple expansion of the antenna unit 4 is thus possible. It also advantageously results in there being an approximately identical amplification in the transmitting and receiving branches.

Figure 3:
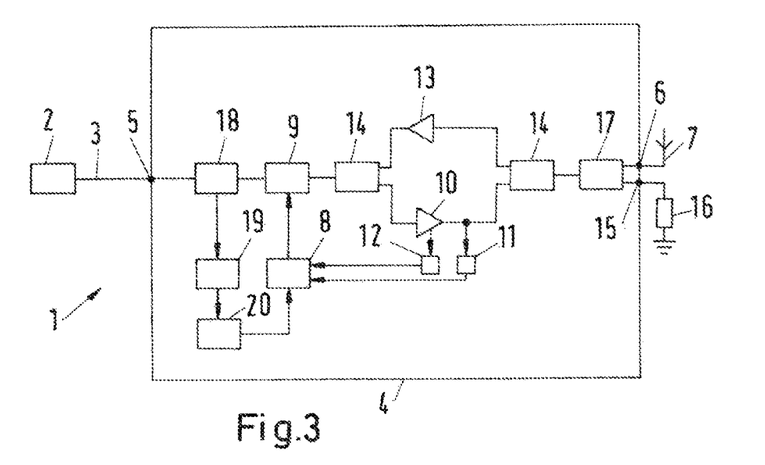

FIG. 3 shows another schematic block diagram of a transmission system 1 according to the disclosure in another embodiment. The antenna unit 4 of the transmission system 1 is in this case substantially designed like the antenna unit 4 shown in FIG. 2. Reference can therefore be made to the corresponding statements relating to FIG. 2. In contrast to the antenna unit 4 shown in FIG. 2, the antenna unit 4 comprises a signal-decoupling means 18 which is arranged in a signal branch section between the device-side signal interface 5 and the attenuator device 9. By means of the signal-decoupling means 18, a signal portion with a prespecified frequency or with frequencies from a prespecified frequency range can be decoupled from a signal applied to this signal branch section. The antenna unit 4 furthermore comprises a signal level detector 19 for determining the signal level of the signal portion decoupled in this way. This signal level detector 19 may, for example, generate a voltage signal which represents the signal level, in particular is proportional thereto. The antenna unit 4 furthermore comprises a comparator 20 which compares the signal level determined in this way to a prespecified threshold value. A signal output of the comparator is connected to the control device 8 using signaling technology.

The signal-decoupling means 18, the signal level detector 19 and the comparator 20 serve to adjust a transmission mode or a receive mode of the antenna unit 4. The transmission mode may in particular be activated when the control device 8 detects that the signal level of the decoupled signal portion is greater than or equal to the prespecified threshold value. In this case, the control device 8 may actuate the switching means 14 in such a way that the signal connection between the device-side signal interface 5 and the antenna-side signal interface 6 takes place via the transmission amplifier device 10. If the control device 8 detects that the signal level of the decoupled signal portion is less than the predetermined threshold value, the receive mode may be activated and the switching means 14 may be actuated in such a way that the signal connection between antenna-side signal interface and device-side signal interface 5 takes place via the receiving amplifier device 13. Furthermore, it is possible for the calibration process to be carried out only when the antenna unit 4 is in the transmission mode.

Figure 4:
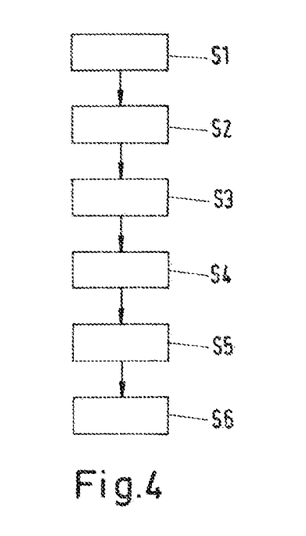

FIG. 4 shows a schematic flowchart of a method according to the disclosure. In a first step S1, a transmission system 1 or a signal-providing unit 2 and an antenna unit 4 (see, for example, FIG. 1) are switched on or activated. This can be done, for example, by switching the transmission system 1 or the signal-providing unit 2 and the antenna unit 4 from a not fully operable state into a completely operable state, for example by establishing the energy supply.

In a second step S2, a calibration signal is generated by the signal-providing unit 2, wherein the calibration signal is generated with the signal strength maximally generatable by the signal-providing unit 2. The maximally generatable signal strength may, for example, be the maximum signal power of the signal-providing unit 2. This calibration signal is transmitted from the signal-providing unit 2 to the antenna unit 4 via the coaxial cable 3 shown in FIG. 1 and is received by the antenna unit 4. In a third step S3, the signal strength of the calibration signal is determined, in particular by means of the power detector 11 shown in FIG. 1. The signal strength of the calibration signal transmitted via the attenuator device 9 and via the transmission amplifier device 10 may in particular be determined. In a fourth step S4, the signal strength of the calibration signal determined in this way is compared to a reference signal strength. In a fifth step S5, an attenuation factor of an attenuator device 9 of the antenna unit 4 is adjusted such that the difference between the reference signal strength and the determined signal strength of the calibration signal is minimized. In a sixth step S6, the calibration process is ended, wherein the antenna unit 4, in particular the attenuator device 9, is then operated in a subsequent normal operation with the previously determined attenuation factor.

It is possible for a temperature of the antenna unit 4 and/or a supply voltage level of the supply voltage of the antenna unit 4 to also be determined during the sequence of the first step S1 to the sixth step S6. This temperature and/or supply voltage level may be stored.

In a normal operation of the antenna unit 4 following the sixth step S6, the temperature may then be continuously detected and compared to the stored temperature during the calibration process, wherein the attenuation factor determined during the calibration process may be changed as above as a function of the difference. The same applies to the supply voltage level. Furthermore, the transmission signal strength may also be detected by means of the power detector 11 during normal operation, i.e., after completion of the calibration process in the sixth step S6. If the transmission signal strength exceeds a maximum permissible transmission signal strength, the attenuation factor determined in the calibration process may likewise be changed, in particular increased.

Figure 5:
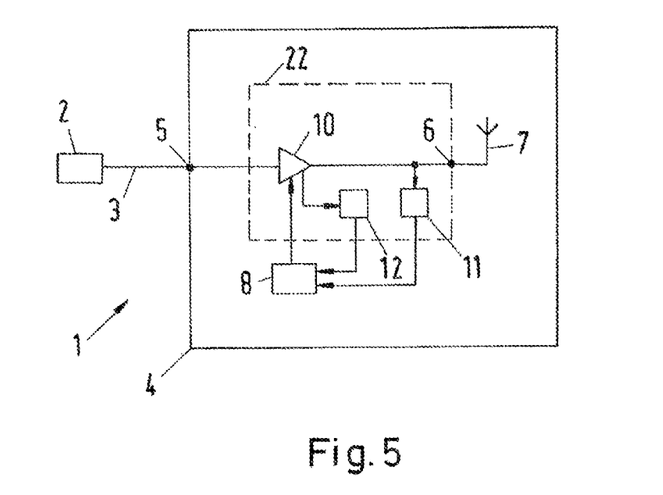

FIG. 5 shows another embodiment of a transmission system 1 according to the disclosure. This transmission system is designed substantially like the transmission system 1 shown in FIG. 1. Reference can therefore be made to the corresponding explanations relating to FIG. 1. In contrast to the embodiment shown in FIG. 1, the antenna unit 4 comprises the antenna 7. In this case, the antenna-side signal interface 6 may be a signal interface of a so-called front-end module 22 which comprises the transmission amplifier device 10 as well as the power detector 11 and the temperature sensor 12.

The antenna unit 4 also does not comprise the attenuator device 9 arranged between the device-side interface 5 and the transmission amplifier device 10. Also shown is that the transmission amplifier device 10 is connected using signaling technology to the control device 8 via an additional control line 21 for adjusting the amplification. The transmission amplifier device 10 is thus an amplifier device with an adjustable gain factor and forms the device for adjusting the signal strength formed by the attenuator device 9 in FIG. 1.

Adjusting the level of the amplification and thus the gain factor of the transmission amplifier device 10 may, for example, be achieved by changing the operating point of the amplifier 10. This may be done by means of the level of the voltage of a voltage signal transmitted via the control line 21. An attenuation device 9 as in the embodiment illustrated in FIG. 1 can thus be omitted.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

The invention claimed is:

1. A method comprising:
providing an antenna unit with a device-side signal interface and an antenna-side signal interface;
receiving a calibration signal with the device-side signal interface in a calibration process;
determining a signal strength of the calibration signal with a power detector;
comparing the determined signal strength with a reference signal strength; and
adjusting a gain factor of a gain controlling device such that the difference between the reference signal strength and a signal strength of a gain modified calibration signal is minimized, wherein the antenna unit is operated with the gain factor set in this way after the calibration process has ended and without transmitting the calibration signal or the gain modified calibration signal to an antenna connected to the antenna-side signal interface;
wherein the calibration process does not send the calibration signal or the gain modified calibration signal to an antenna connected to the antenna-side signal interface, thereby avoiding a transmission signal that could otherwise form an undesired interference signal emitted by the antenna that disturbs operation of other units.

2. The method of claim 1, wherein the calibration signal is generated by a transmitting/receiving unit and is transmitted to the antenna unit via a coaxial cable via the device-side signal interface, and wherein the method includes compensating for signal loss caused by the coaxial cable without additional signal transmission between the antenna unit and the transmitting/receiving unit.

3. The method of claim 2, wherein the transmitting/receiving unit generates the calibration signal at a maximum signal strength that can be generated or at a signal strength which corresponds to a predetermined proportion of the maximum signal strength.

4. The method of claim 3, wherein the ratio of the reference signal strength to the maximum signal strength is equal to the ratio of the signal strength of the signal generated by the transmitting/receiving unit to the maximum signal strength that can be generated.

5. The method of claim 4, wherein the provision of the calibration signal and the adjusting of the gain factor is carried out each time the antenna unit is switched on or activated when an ignition on state is established for a vehicle in which the antenna unit arranged.

6. The method of claim 1, wherein the gain controlling device is either a damper device or an amplifier device.

7. The method of claim 1, wherein the gain controlling device sets the signal strength of a transmission signal and a signal strength of a reception signal.

8. The method of claim 1, further comprising the step of determining a variation in temperature, wherein the gain factor of the gain control device is changed as a function of the variation in temperature such that a maximum reference power of the antenna unit is not exceeded or undershot when a transmitting/receiving unit that generates the calibration signal is transmitting at maximum power.

9. The method of claim 1, further including the step of determining a supply voltage of the antenna unit, wherein the gain factor of the gain control device is changed as a function of the supply voltage thereby allowing an overall amplification of the antenna unit to remain substantially constant when the supply voltage changes by fully or at least partially compensating for supply-voltage-related changes in the amplification.

10. The method of claim 1, including the step of activating a transmission mode by the antenna unit, wherein the calibration process is carried out in the transmission mode.

11. The method of claim 1, wherein the gain factor at the beginning of the calibration process is determined as a function of at least one gain factor which was determined in a previous calibration process.

12. The method of claim 1, wherein the antenna unit includes a control device and the control device detects an error state when the minimized difference is greater than a predetermined threshold value.

13. The method of claim 1, including the step of determining a signal strength of a transmission signal, wherein the gain factor determined in a previous calibration process is changed as a function of the signal strength.

14. The method of claim 1, wherein:
the gain factor is an attenuation factor; and
the method incudes using an attenuator device for adjusting the attenuation factor such that the antenna unit is operated with the attenuation factor after the calibration process has ended.

15. A method comprising:
providing an antenna unit with a device-side signal interface and an antenna-side signal interface;
receiving a calibration signal with the device-side signal interface in a calibration process;
determining a signal strength of the calibration signal with a power detector;
comparing the determined signal strength with a reference signal strength; and adjusting a gain factor of a gain controlling device such that the difference between the reference signal strength and a signal strength of a gain modified calibration signal is minimized, wherein the antenna unit is operated with the gain factor set in this way after the calibration process has ended and without transmitting the calibration signal or the gain modified calibration signal to an antenna connected to the antenna-side signal interface;
wherein:
the gain factor is an attenuation factor;
the method incudes using an attenuator device for adjusting the attenuation factor such that the antenna unit is operated with the attenuation factor after the calibration process has ended;
the antenna unit includes a transmission signal branch and a received signal branch;
the attenuator device is arranged both in the transmission signal branch and in the received signal branch; and
the method includes using the attenuation factor determined during the calibration process for both the attenuation factor adjusted in a transmission mode of the antenna unit and the attenuation factor adjusted in a receive mode of the antenna unit.

16. The method of claim 15, wherein the calibration process does not send the calibration signal or the gain modified calibration signal to an antenna connected to the antenna-side signal interface, thereby avoiding a transmission signal that could otherwise form an undesired interference signal emitted by the antenna that disturbs operation of other units.

17. The method of claim 1, wherein the calibration signal comprises:
a modulated signal with a low crest factor describing a ratio of peak power to an average power of the modulated signal;
an OFDM-modulated (Orthogonal Frequency-Division Multiplexing) signal; or
an unmodulated continuous wave signal.

18. A method comprising:
providing an antenna unit with a device-side signal interface and an antenna-side signal interface;
receiving a calibration signal with the device-side signal interface in a calibration process;
determining a signal strength of the calibration signal with a power detector;
comparing the determined signal strength with a reference signal strength; and
adjusting a gain factor of a gain controlling device such that the difference between the reference signal strength and a signal strength of a gain modified calibration signal is minimized, wherein the antenna unit is operated with the gain factor set in this way after the calibration process has ended and without transmitting the calibration signal or the gain modified calibration signal to an antenna connected to the antenna-side signal interface;
wherein the method includes transmitting the gain modified calibration signal to an antenna equivalent resistor without transmitting the gain modified calibration signal to an antenna connected to the antenna-side signal interface, thereby avoiding a transmission signal that could otherwise form an undesired interference signal emitted by the antenna that disturbs operation of other units.

19. The method of claim 1, wherein
the method includes:
transmitting the calibration signal via a coaxial cable to the device-side signal interface;
compensating for signal loss caused by the coaxial cable without additional signal transmission between the antenna unit and a transmitting/receiving unit that generated the calibration signal;
transmitting the gain modified calibration signal to an antenna equivalent resistor without transmitting the gain modified calibration signal to an antenna connected to the antenna-side signal interface, thereby avoiding a transmission signal that could otherwise form an undesired interference signal emitted by the antenna that disturbs operation of other units;
determining a variation in temperature, wherein the gain factor of the gain control device is changed as a function of the variation in temperature such that a maximum reference power of the antenna unit is not exceeded or undershot when a transmitting/receiving unit that generates the calibration signal is transmitting at maximum power; and
determining a supply voltage of the antenna unit, wherein the gain factor of the gain control device is changed as a function of the supply voltage thereby allowing an overall amplification of the antenna unit to remain substantially constant when the supply voltage changes by fully or at least partially compensating for supply-voltage-related changes in the amplification.

* * * * *